United States Patent
Chen et al.

(10) Patent No.: US 7,608,996 B2
(45) Date of Patent: Oct. 27, 2009

(54) ELECTROLUMINESCENCE DISPLAY AND METHOD FOR MANUFACTURING THE SAME

(75) Inventors: Ming-Daw Chen, Hsin Chu (TW); Jih-Fon Huang, Chu Pei (TW)

(73) Assignee: Industrial Technology Research Institute, Hsinchu County (TW)

( * ) Notice: Subject to any disclaimer, the term of this patent is extended or adjusted under 35 U.S.C. 154(b) by 452 days.

(21) Appl. No.: 11/356,969

(22) Filed: Feb. 21, 2006

(65) Prior Publication Data

US 2007/0046182 A1 Mar. 1, 2007

(30) Foreign Application Priority Data

Aug. 30, 2005 (TW) .............................. 94129716 A

(51) Int. Cl.
*H01J 1/62* (2006.01)
*H01J 63/04* (2006.01)

(52) U.S. Cl. ...................... 313/506; 313/498; 313/504; 313/512; 313/292

(58) Field of Classification Search ......... 313/498–512, 313/238, 292, 609; 349/156
See application file for complete search history.

(56) References Cited

U.S. PATENT DOCUMENTS

| | | | |
|---|---|---|---|
| 5,268,782 A * | 12/1993 | Wenz et al. .................. 349/156 |
| 5,729,319 A * | 3/1998 | Inou et al. .................... 349/156 |
| 6,541,908 B1 | 4/2003 | Cheung et al. |
| 6,734,930 B2 | 5/2004 | Yu et al. |
| 6,738,113 B2 | 5/2004 | Yu et al. |
| 6,744,197 B2 | 6/2004 | Park et al. |
| 6,777,710 B1 | 8/2004 | Koyama |
| 2002/0033908 A1 * | 3/2002 | Mori et al. .................... 349/61 |
| 2003/0052869 A1 * | 3/2003 | Fujii et al. ................... 345/204 |
| 2003/0063231 A1 | 4/2003 | Dai et al. |
| 2003/0205969 A1 | 11/2003 | Park et al. |
| 2003/0227582 A1 | 12/2003 | Yu et al. |
| 2004/0090569 A1 | 5/2004 | Yu et al. |
| 2004/0125328 A1 * | 7/2004 | Chae et al. ................... 349/187 |
| 2005/0128399 A1 * | 6/2005 | Kim et al. .................... 349/129 |
| 2006/0290276 A1 * | 12/2006 | Cok et al. .................... 313/512 |
| 2007/0013291 A1 * | 1/2007 | Cok et al. .................... 313/501 |

* cited by examiner

*Primary Examiner*—Toan Ton
*Assistant Examiner*—Kevin Quarterman
(74) *Attorney, Agent, or Firm*—Rabin & Berdo, P.C.

(57) ABSTRACT

An electroluminescence display and a manufacturing method therefore are disclosed in the present invention. The present invention combines an electroluminescence component and a passive component into a single display component for a display screen. The present invention has a simple manufacturing process, and decreases power consumption and the total size of a display screen.

10 Claims, 2 Drawing Sheets

ELECTROLUMINESCENCE DISPLAY AND METHOD FOR MANUFACTURING THE SAME

BACKGROUND OF THE INVENTION

1. Field of the Invention

The present invention relates to a display and a method for manufacturing the same, and more particularly, to an electroluminescence display and a method for manufacturing the same.

2. Description of Related Art

A display screen is an interface for general electronic equipment or a flexible electronic system. A super-thin flexible electronic system usually uses a reflective liquid crystal display. However, sometimes it uses a self-emitting display in a special environment. An organic light-emitting diode (hereinafter abbreviated as OLED) is the best choice as a light source for a self-emitting display on a flexible substrate. Therefore, a super-thin flexible electronic system must include OLED as a core technology for the flexible substrate.

Several conventional OLED application patents have been developed for satisfying the demands stated above. U.S. Pat. No. 6,541,908, electronic light emissive displays incorporating transparent and conductive zinc oxide thin film discloses the use of co-doped zinc oxide (n-type) as the cathode of organic light-emitting diode (OLED) display, field emission displays (FEDs) and vacuum microelectronic devices. U.S. Pat. No. 6,744,197 and U.S. patent App. No. 2003/0205969A1 discloses an organic electroluminescent display device and method of fabricating same. US patent App. Nos. 2003/0227582A1 and 2004/0090569A1, U.S. Pat. Nos. 6,734,930B2 and 6,738,113B2 disclose a structure for an organic light-emitting material TFT LCD and a method for making the same.

US patent App. No. 2002/0033908A1 discloses a liquid crystal display for lowering power consumption. U.S. Pat. No. 6,777,710 discloses an organic light-emitting device with constant luminance. US patent App. No. 2003/0063231A1 discloses a LCD panel integrated with OLED.

SUMMARY OF THE INVENTION

The main object of the present invention is to provide an electroluminescence display and a method for manufacturing the same which decreases both power consumption and the size of the display.

For achieving the object as stated above, the present invention provides a manufacturing method for an electroluminescence display comprising: proving an upper substrate and a bottom substrate; forming a conductive layer on said bottom substrate; forming a plurality of wall structures on said conductive layer; filling a plurality of liquid crystal display media on at least one first space, wherein the at least one first space is formed by said wall structures; forming a plurality of organic material on at least one second space, wherein the at least one second space is formed by said wall structures; making a plurality of seals and at least one third space on said conductive layer; forming a protective layer on said liquid crystals; and combining said upper substrate and said bottom substrate.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF PREFERRED EMBODIMENTS

The present invention uses an electroluminescence component together with a passive component to provide a display (may be bistable display) having electroluminescence component and passive component. Reference is made to FIGS. 1-6, which show a manufacturing procedure for an electroluminescence display in accordance with a preferred embodiment of the present invention. The manufacturing procedure comprises the steps described as follows.

Figure 1:
FIG. 1 shows a bottom substrate made in accordance with the manufacturing procedure of the present invention.

Reference is made to FIG. 1, which shows a bottom substrate made in accordance with the manufacturing procedure of the present invention. First, a bottom substrate 10 is provided. The bottom substrate 10 is plastic substrate, metal-foil substrate or glass substrate. The plastic material can be polyethylene terephthalate, polyethersulfone (PES), polycarbonate, photopolymer resins or thermosetting resins. The bottom substrate 10 has a color filter layer formed thereon (not shown). Forming this color filter layer is not essential in the manufacturing process. Subsequently, a conductive layer 12 is formed on the bottom substrate 10. Forming the conductive layer 12 utilizes LTPS or other related manufacturing techniques. The conductive layer 12 can be a TFT having a driving circuit. The conductive layer 12 is designed to be a driving electrode for the passive component and the electroluminescence component.

Figure 2:
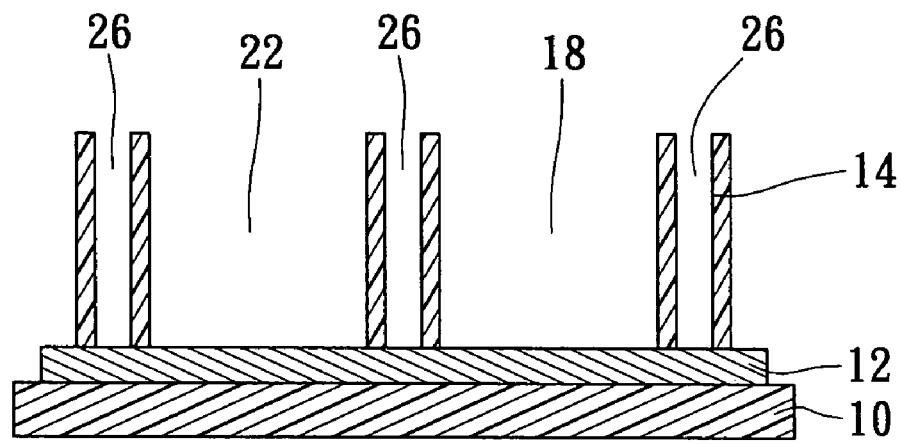
FIG. 2 shows wall structures made in accordance with the manufacturing procedure of the present invention.

Reference is made to FIG. 2, which shows wall structures made in accordance with the manufacturing procedure of the present invention. A plurality of wall structures 14 are formed on the conductive layer 12. Forming the wall structures 14 on the conductive layer 12 further comprises a photosynthesis layer formed on the conductive layer 12 via a coating process. A photoresistant layer is formed on the photosynthesis layer via a coating process. The wall structures are defined and formed using a mask and an etching process.

Figure 3:
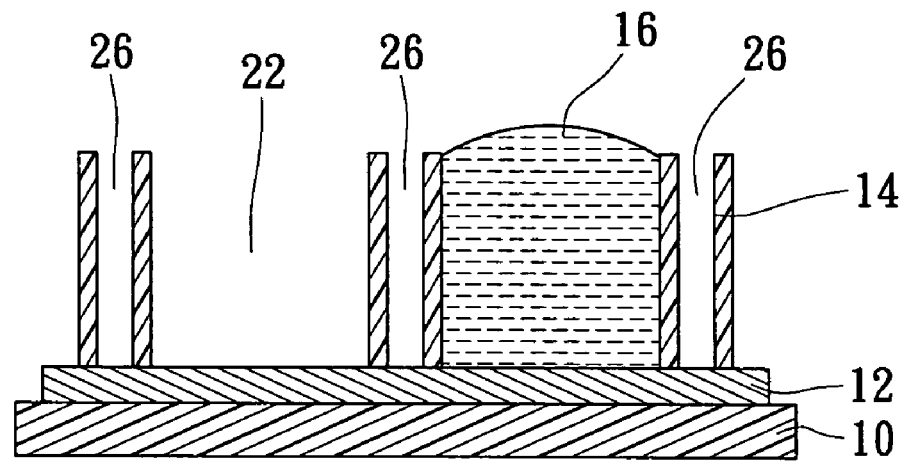
FIG. 3 is a schematic diagram of the passive reflective component in accordance with the present invention.

Reference is made to FIG. 3, which shows a schematic diagram of the passive reflective component in accordance with the present invention. A plurality of liquid crystal display media 16 can be filled in at least one first space 18 (shown in FIG. 2) between the wall structures 14 via a one-drop-fill (ODF) process. When the filling step is finished, the substrate having the passive reflective component will be formed.

Figure 4:
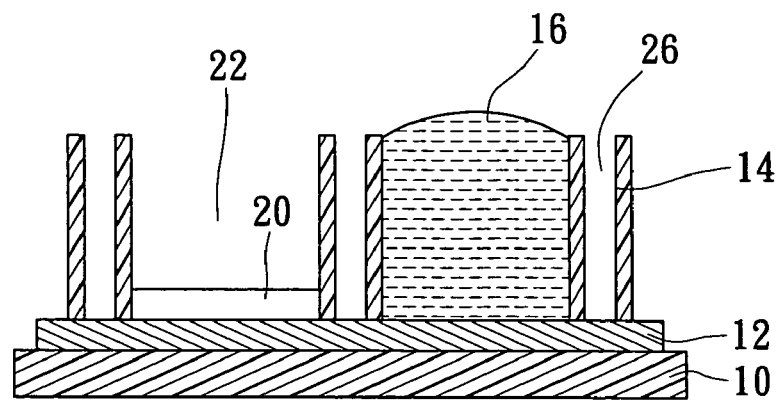
FIG. 4 is a schematic diagram of the electroluminescence component in accordance with the present invention.

Reference is made to FIG. 4, which shows a schematic diagram of the electroluminescence component in accordance with the present invention. First, the substrate having the passive reflective component is moved on an Organic Light Emitting Diode fixture and a vacuum is created. A plurality of organic material 20 is formed on at least one second space 22 between the wall structures 14 via a distillation process. The organic materials 20 are made of organic light emitting diodes. The passive reflective component is covered with a shadow mask design so that it is not covered by the distillation material. A cathode material 20 also has the shadow mask design that is different from a general organic light emitting diode process. Thus the substrate having the electroluminescence component is formed.

Figure 5:
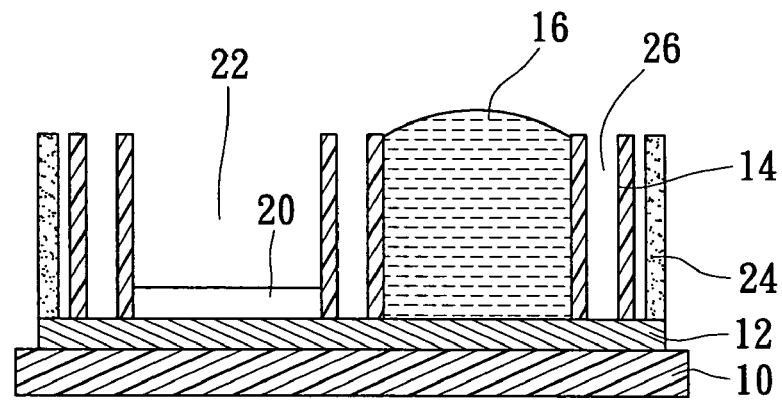
FIG. 5 shows a seal made in accordance with the manufacturing procedure of the present invention.
Figure 6:
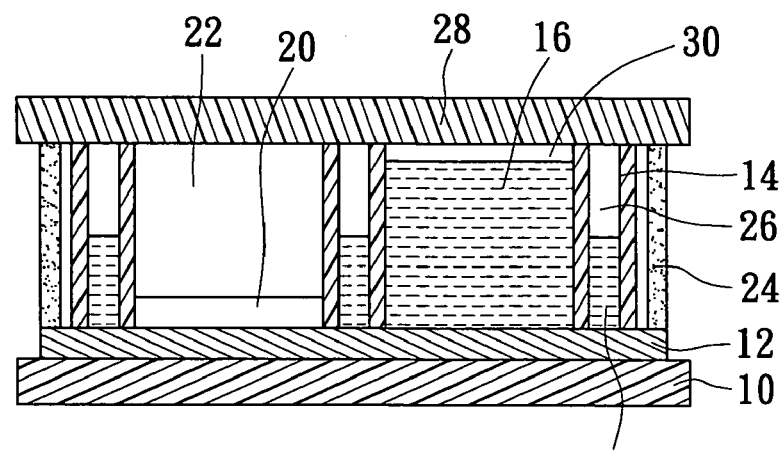
FIG. 6 is a schematic diagram of the combination of the passive display component with the electroluminescence display component in accordance with the present invention.

Next, a plurality of seals 24 and at least one third space 26 is made on the conductive layer 12 as shown in FIG. 5. A bottom is made when the above processes are finished. Therein, the bottom may be having a bistable component. Reference is made to FIG. 6, which shows a schematic diagram of the combination of the passive display component with the electroluminescence display component in accordance with the present invention. A top substrate 28 is combined with the bottom via a pressing process or an ultraviolet exposure process. Therein, the bottom may be having a bistable component. The top substrate 28 is composed of plastic substrate, metal-foil substrate or glass substrate. The plastic material can be polyethylene terephthalate, polyethersulfone (PES), polycarbonate, photopolymer resin or thermosetting resin. Surplus liquid crystal display media 16 of the passive reflective component exude inside the third space 26 when the pressing process is being performed. Finally, the polymer inside the liquid crystal display media 16 is separated and cured thereon via the ultraviolet exposure to form a protective layer 30. The protective layer 30 seals the liquid crystal display media 16 so that the liquid crystal display media 16 is not contacted by the electroluminescence component in actual application. The electroluminescence display (may be a passive reflective component or a passive transparent component) is made through the combination process.

The type of organic light emitting diode may be either a top emitter, a bottom emitter or two-side emitter organic light-emitting diode. If a top emitter is selected for the organic light emitting, the display having organic light emitting diode does not require a backlight because the cathode is transparent. The display with a transflective function is thinner, lighter and easier to assembly.

Alternatively, when a bottom emitter is selected for the organic light emitting diode, there are two independent driving circuits. A first driving circuit sits on the organic materials and a second driving circuit sits on the liquid crystal display media. The first driving circuit is designed inside of the second driving circuit. This type could be applied to a mobile panel and decreases the weight and thickness of the display panel. In addition, it also increases the opening rate of the organic materials of the bottom emitter.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electroluminescence display, comprising:
   an upper substrate and a bottom substrate;
   a conductive layer formed on said bottom substrate;
   a plurality of wall structures formed on said conductive layer, wherein
      a first neighboring pair of said plurality of wall structures forms a first space that is filled by a first material;
      a second neighboring pair of said plurality of wall structures forms a second space that is filled by a second material different from the first material; and
      the first and the second neighboring pairs have a third space formed therebetween for containing a surplus of the first material in a manufacturing process of the electroluminescence display;
   a plurality of seals made on said conductive layer; and
   a protective layer formed on said first material located in the first space;
   whereby said upper substrate and said bottom substrate are combined together.

2. The display as claimed in claim 1, wherein the electroluminescence display is a passive reflective component or a passive transparent component.

3. The display as claimed in claim 1, wherein the upper substrate and the bottom substrate are a plastic substrate, metal-foil substrate or a glass substrate.

4. The display as claimed in claim 1, wherein the wall structures are formed via an etching process.

5. The display as claimed in claim 1, wherein the first and the second space are filled via a one-drop-fill process.

6. The display as claimed in claim 1, wherein the second material is made of an organic light-emitting diode.

7. The display as claimed in claim 6, wherein the organic light-emitting diode is a top emitter, a bottom emitter organic light-emitting diode or two-side emitter organic light-emitting diode.

8. The display as claimed in claim 7, wherein a cathode is a transparent electrode when the organic light-emitting diode is the top emitter.

9. The display as claimed in claim 1, wherein the first material is a liquid crystal display medium.

10. An electroluminescence display, comprising:
    an upper substrate and a bottom substrate;
    a conductive layer formed on said bottom substrate;
    a plurality of wall structures formed on said conductive layer, wherein
       at least a first neighboring pair of said plurality of wall structures forms a first space that is filled by a liquid crystal display medium;
       at least a second neighboring pair of said plurality of wall structures forms a second space that is filled by an organic material; and
       at least a third neighboring pair of said plurality of wall structures forms a third space for containing a surplus of said liquid crystal display medium, wherein the surplus liquid crystal display medium of the electroluminescence display exudes inside said third space when a pressing process is performed;
    a plurality of seals made on said conductive layer; and
    a protective layer formed on said liquid crystal display medium located in the first space;
    whereby said upper substrate and said bottom substrate are combined together.

* * * * *

UNITED STATES PATENT AND TRADEMARK OFFICE
CERTIFICATE OF CORRECTION

PATENT NO. : 7,608,996 B2  Page 1 of 1
APPLICATION NO. : 11/356969
DATED : October 27, 2009
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 611 days.

Signed and Sealed this

Twelfth Day of October, 2010

David J. Kappos
*Director of the United States Patent and Trademark Office*